United States Patent [19]

Nomoto

[11] Patent Number: 5,307,516
[45] Date of Patent: Apr. 26, 1994

[54] MAGNETOSTATIC WAVE S/N ENHANCER AND RECEIVING APPARATUS OF FM OR PM SIGNAL USING THE SAME

[75] Inventor: Toshihiro Nomoto, Machida, Japan

[73] Assignee: Nippon Hoso Kyokai, Tokyo, Japan

[21] Appl. No.: 760,070

[22] Filed: Sep. 13, 1991

[30] Foreign Application Priority Data

Sep. 14, 1990 [JP] Japan ................................. 2-242741
Sep. 14, 1990 [JP] Japan ................................. 2-242742

[51] Int. Cl.$^5$ ............................................. H04B 1/26
[52] U.S. Cl. ................................. 455/304; 455/306; 455/312; 455/214; 333/148; 333/201
[58] Field of Search ............... 455/3.2, 214, 304, 306, 455/312; 333/117, 148, 201, 202 M

[56] References Cited

U.S. PATENT DOCUMENTS

| | | | |
|---|---|---|---|
| 3,875,537 | 4/1975 | Dolby | 333/201 |
| 4,127,819 | 11/1978 | Keane | 455/192.1 |
| 4,283,692 | 8/1981 | Adam | 333/24.2 |
| 4,780,667 | 10/1988 | Reese, Jr. et al. | 333/201 |
| 4,814,718 | 3/1989 | Agrintaru et al. | 455/214 |

FOREIGN PATENT DOCUMENTS

| | | | |
|---|---|---|---|
| 0125002 | 5/1988 | Japan | 333/148 |
| 1-149609 | 6/1989 | Japan | 333/201 |
| 0053314 | 2/1990 | Japan | 333/201 |

OTHER PUBLICATIONS

"Magnetostatic Wave and Magnetostatic Wave-Optic Filler Technology" Adam et al; *Microwave Journal* Nov. 1990; pp. 105-112 and 115.
"Broadband Microwave Signal to Noise Enhancer"; Adam, J. D. *IEEE Transactions*, vol. MAG-16, No. 5, pp. 1168-1170 (1980).
"A Slot Line MSW Signal-to-Noise Enhancer"; Adam, J. D. *IEEE Transactions*, vol. Mag-21, No. 5, pp. 1974-1976 (1985).
"Microwave Magnetostatic Delay Devices Based on Epitaxial Yttrium Iron Garnet", Adam et al.; *IEEE*, vol. 64, No. 5; May 1976.
"A Magnetostatic Wave Signal to Noise Enhancer" Adam et al, *Applied Physics Letters*, vol. 36; Mar. 15, 1980,

*Primary Examiner*—Reinhard J. Eisenzopf
*Assistant Examiner*—Andrew Faile
*Attorney, Agent, or Firm*—Antonelli, Terry, Stout & Kraus

[57] ABSTRACT

A magnetostatic wave (MSW) signal-to-noise (S/N) enhancer includes a divider for dividing an input signal into a first and a second path signals, first and second microwave-MSW transducers for transducing the first and second path signals into the first and second path transduced signals, and a combiner for combining the first and second path transduced signals in opposite phase to each other. The first path signal contains a desired signal which is higher than a first saturation level and a noise component which is lower than the first path threshold power level. The first microwave-MSW transducer outputs the noise in linear operation and the desired signal in saturation operation. All the component signals of the second path signal including noise are lower than the second path threshold power level and are output in a linear operation by the second microwave-MSW transducer.

38 Claims, 10 Drawing Sheets

MAGNETOSTATIC WAVE S/N ENHANCER AND RECEIVING APPARATUS OF FM OR PM SIGNAL USING THE SAME

BACKGROUND OF THE INVENTION

1. Field of the Invention

The present invention relates to a receiving apparatus for an FM signal or a PM signal which apparatus can enhance a C/N (Carrier-to-Noise Ratio) of an input signal at a microwave-frequency range before demodulation to enhance an S/N (Signal-to-Noise Ratio) of a demodulated signal, and the present invention also relates to a magnetostatic wave (MSW) S/N enhancer which can be used in the receiving apparatus for enhancing the C/N, more particularly, to the MSW S/N enhancer which can enhance the C/N of a microwave signal input to the receiving apparatus, based on the frequency-selective saturation characteristics of the MSW.

2. Description of the Related Art

In order to improve the threshold of an FM signal, for example, the conventional receiving apparatus for an FM signal or a PM signal has provided with a narrow bandpass filter inserted in a transmission path for a radio-frequency (RF) signal, which filter makes contribution to reduction of an equivalent noise bandwidth. Alternatively, for that purpose, the conventional receiving apparatus has employed a feedback demodulator using a frequency-locked loop (FLL) or a phase-locked loop (PLL).

In case that the signal received by the FM signal receiving apparatus has a uniform noise spectrum, when the signal is a sine wave, relation between a C/N of the received signal and an S/N of the demodulated signal can be represented as follows:

$$\begin{aligned} S/N &= (3/2)\,(C/n_o)\,(\Delta F^2/fm^3) \\ &= (3/2)\,B\,(\Delta f^2/fm^3)\,(C/N) \end{aligned} \quad (1)$$

wherein C is a power (W) of the input RF signal, $n_o$ is a noise distribution (W/Hz) including the signal, $\Delta f$ is a maximum frequency deviation ($Hz_{p\text{-}p}$), f is a bandwidth of a demodulated signal (Hz), and B is a transmission bandwidth of the RF signal.

$\Delta f$, $f_m$ and B depend on how the FM signal is modulated in a transmitting apparatus. In case that $n_o$ is uniform with respect to frequency, the S/N of the demodulated signal is definitely in proportion to a ratio of C to $n_o$, independently of the transmission bandwidth B of the RF signal, as shown in the equation (1). Therefore, even if the feedback demodulator is employed in the receiving apparatus, when the C/N of the received signal is higher than the FM threshold, enhancement of the S/N of the demodulated signal cannot be accomplished and enhancement of the S/N requires enhancement of the C/N itself.

SUMMARY OF THE INVENTION

It is an object of the invention to provide a receiving apparatus which makes it possible to improve an S/N of a demodulated signal by enhancing a C/N itself of a received signal.

It is another object of the invention to provide a magnetostatic wave S/N enhancer which is used in a receiving apparatus and sufficiently makes it possible to enhance a C/N of an input signal even when the input signal has a low C/N, based on the fact that the difference between a threshold power level $P_L$ and an enhancement-limiting power level $P_H$ of the enhancer is very small because of a steep change of an input-to-output (I/O) characteristic from the $P_L$ to the $P_H$.

In carrying out the object, the receiving apparatus for an FM signal or a PM signal according to the invention includes a magnetostatic wave S/N enhancer provided in the front of a demodulator, for changing distribution of a noise spectrum included in an input signal, the enhancer having a frequency-selective saturation characteristic. This is because the noise distribution $n_o$ of a received RF signal is relatively changed with respect to a desired wave signal power by using the frequency-selective saturation characteristic of the enhancer which is used in the microwave frequency range. It results in reducing noise power near the desired signal and enhancing the C/N, thereby improving the S/N of the demodulated signal.

In carrying out another object, the magnetostatic wave (MSW) S/N enhancer employs a first and a second microwave-MSW transducers having a frequency-selective saturation characteristic and includes a divider provided at the input side for dividing the input signal into a first and a second path signals different in power level, a first MSW transducer provided at a first path for processing a relatively high leveled signal and a second MSW transducer provided at a second path, having the substantially same I/O characteristics as the first microwave-MSW transducer, for processing the relatively low leveled signal, and a combiner provided at the output side, for combining the first path signal and the second path signal at a predetermined level.

DESCRIPTION OF THE PREFERRED EMBODIMENTS

According to the present invention, a magnetostatic wave (MSW) S/N enhancer is inserted in the front of an FM demodulator in a BS (Broadcasting Satellite) receiving apparatus, for example, to enhance a carrier-to-noise ratio (C/N), thereby to improve a signal-to-noise ratio (S/N) of a demodulated signal.

Herein, the embodiments of the present invention will be described in detail referring to the appended drawings.

Figure 1A:
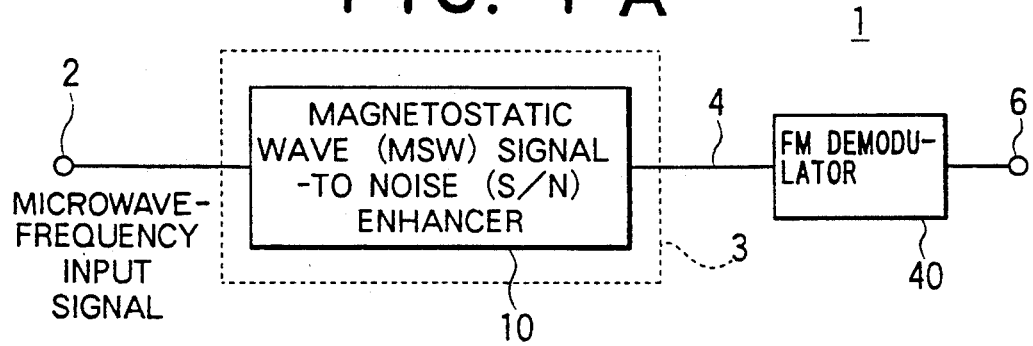
FIGS. 1A, 1B and 1C are block diagrams, respectively, showing receiving apparatuses according to a first, a second, and a third embodiments of the invention.

FIG. 1A is a block diagram showing a principle of a receiving apparatus 1 included in a first embodiment of the present invention. A radio-frequency (RF) input signal 2 at a microwave frequency range is input to a MSW S/N enhancer 10 included in a C/N enhancing unit 3. The MSW S/N enhancer 10 supplies a signal 4 having an enhanced C/N to an FM demodulator 40. The demodulator 40 supplies a demodulated signal 6 having an improved S/N. The demodulator 40 may employ any type of demodulation.

Figure 1B:
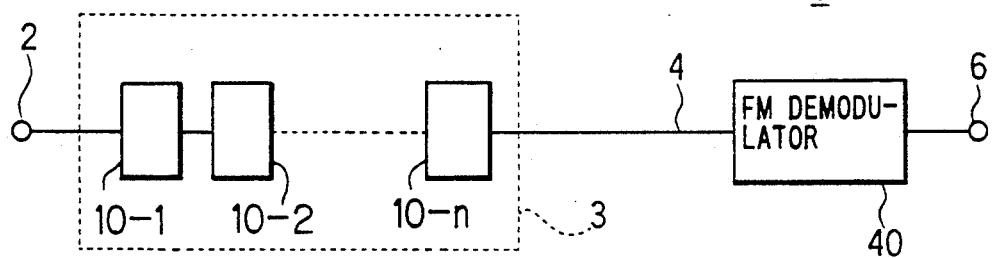
Figure 1C:
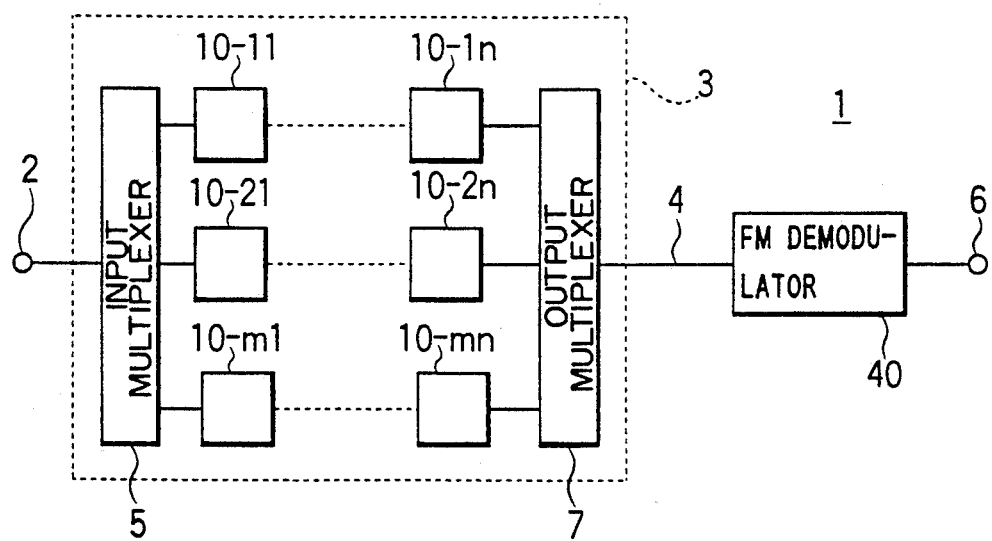

The first embodiment shown in FIG. 1A employs one MSW S/N enhancer but may employ two or more enhancers. Turning to FIG. 1B, when the enhancer 10-1 of the C/N enhancing unit 3 does not sufficiently enhance the C/N other MSW S/N enhancers 10-2 to 10-n having the same operating frequency band as the enhancer 10-1 may be cascade-connected with the enhancer 10-1, as shown in FIG. 1B, thereby remarkably enhance the C/N. As for another arrangement, as shown in FIG. 1C, two or more enhancers 10-11 to 10-11, . . . , and 10-ml to 10-mn for respective operating frequency bands are cascadedconnected and parallel-connected. As a result, the overall operating frequency band can be made m-times wider and the C/N can be enhanced by n-times, compared with only one enhancer. In this arrangement, the input signal 2 is divided into the enhancer trains corresponding to specified frequency bands through an input multiplexer 5. In each enhancer train the C/N of the signal is enhanced. Then, by an output multiplexer 7, the enhanced signals are combined. It results in making it possible to enhance the C/N more in the wider frequency band. Each of the enhancers shown in FIGS. 1B and 1C is of the same as the enhancer 10 shown in FIG. 1A.

Figure 2:
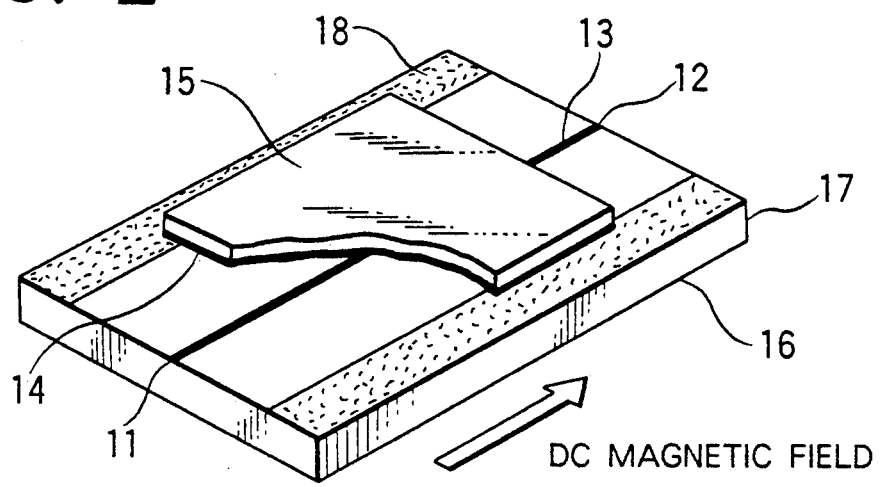
FIG. 2 is a view showing structure of one embodiment of a conventional MSW S/N enhancer used in the receiving apparatus according to the invention.
Figure 3:
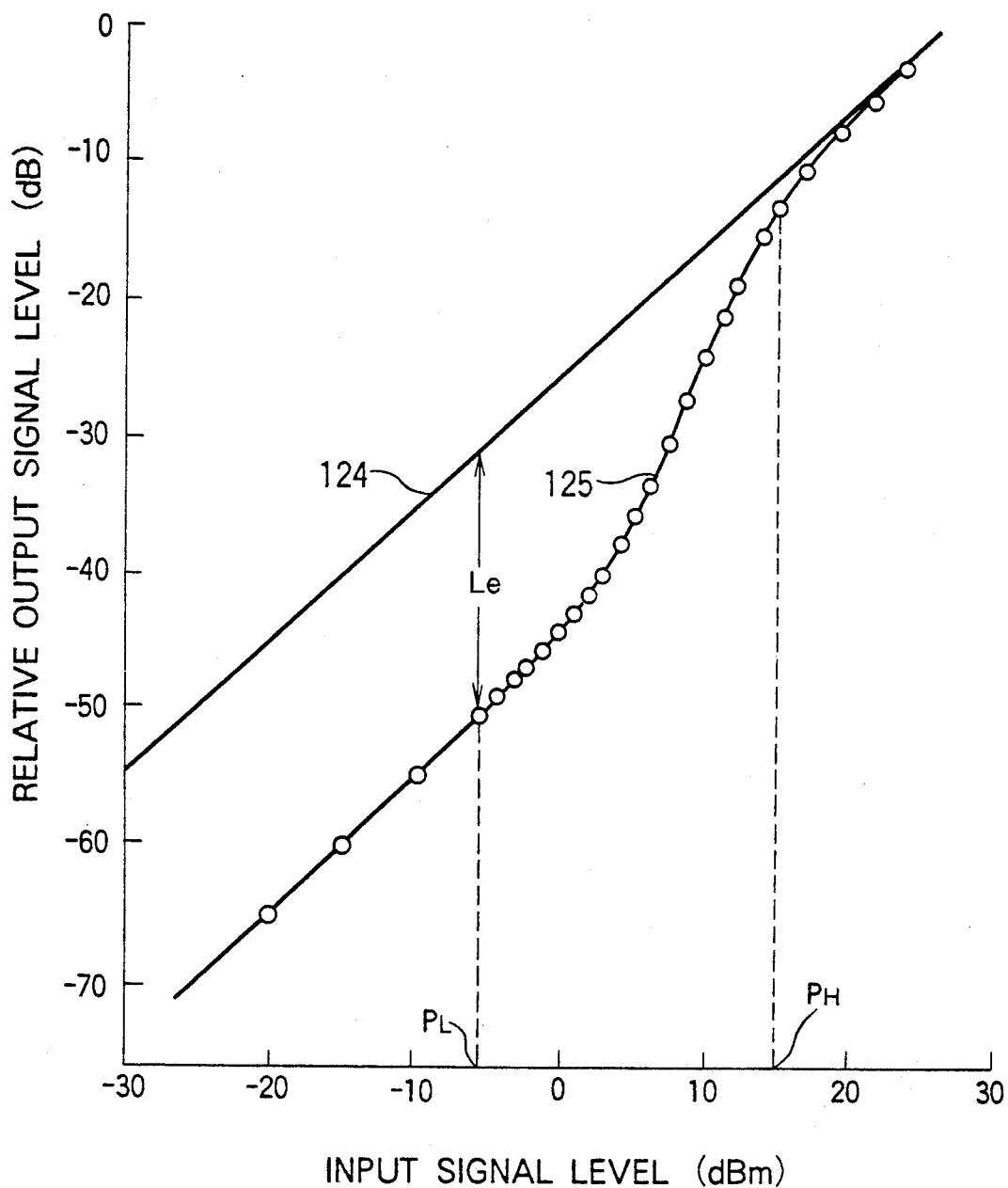
FIG. 3 is a plot showing an input-to-output characteristic of the conventional MSW S/N enhancer.

FIG. 2 shows a typical structure of the conventional MSW S/N enhancer 10 used in the embodiment of FIG. 1A. The enhancer 10 has the structure wherein a YIG (Yttrium-Iron-Garnet) film 14 grown on a GGG (Gadolinium-Gallium-Garnet) substrate is located on to a microstrip line or a slot line 13 formed on a dielectric substrate 17 for the purpose of transducing the input signal into a magnetostatic wave in the YIG film. The thickness of the YIG film 14 is tens of micrometers, for example. Magnetostatic wave absorbers 18 are located on both sides of the dielectric substrate 17. The enhancer 10 has an input-to-output (I/O) characteristic shown in FIG. 3 and the input and output spectrum characteristics shown in FIGS. 4A and 4B, respectively. In FIG. 3, an axis of abscissa denotes an input signal level represented in dBm and an axis of ordinate denotes a relative output signal level represented in dB. A line 124 represents the linear I/O characteristic as a reference. A curve 125 represents the I/O characteristic of the enhancer. $P_L$ denotes a threshold level of the enhancer and $P_H$ denotes an enhancement-limiting power level.

A microwave signal is input from an input port 11 and is propagated on the microstrip line 13 toward an output port 12. During the propagation, the input microwave signal is transduced into a magnetostatic wave in proportion to the input power level of the microwave. The magnetostatic wave is propagated in the YIG film 14 and is absorbed by the absorbers 18. Hence, the microwave signal at the output port 12 is attenuated by its energy transduced into magnetostatic wave. However, if the input microwave signal is of a higher level than a threshold power level Pth shown in FIG. 9, the energy transduced into the electromagnetic wave is saturated, so that the I/O characteristic becomes non-linear. It results in reducing the attenuation of the microwave energy, thereby increasing most of the input microwave energy to appear at the output port 12. That is to say, the saturation phenomenon of the magnetostatic wave makes a small insertion-loss for a high power input but makes a large insertion-loss for a low power input. The saturation phenomenon in transduction of the electromagnetic wave into the magnetostatic wave is frequencyselective. Therefore, in case that two or more signals different in frequency are input to the enhancer 10 at a time, the insertion loss is determined due to each signal power level. The information about this phenomenon is described in the references "Broadband Microwave Signal-to-Noise Enhancer" by J. D. Adam, IEEE Trans., vol. MAG-16, No. 5, pp. 1168–1170 (1980) and "A Slot-Line MSW Signal-to-Noise Enhancer" by J. D. Adam, IEEE Trans., vol. MAG-21, No. 5, pp. 1794–1796 (1985).

Figure 4A:
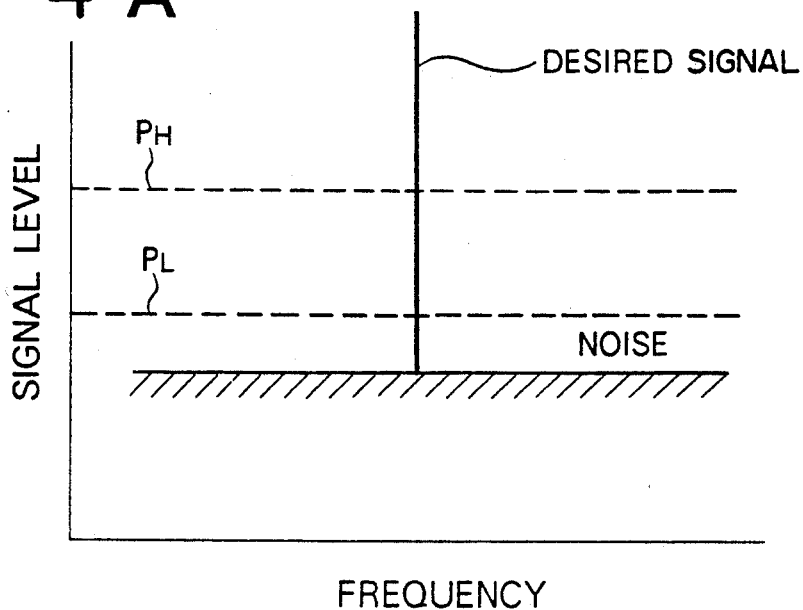
FIGS. 4A and 4B are diagrams, respectively, showing a desired signal including noise at input and output ports of MSW S/N enhancer.
Figure 4B:
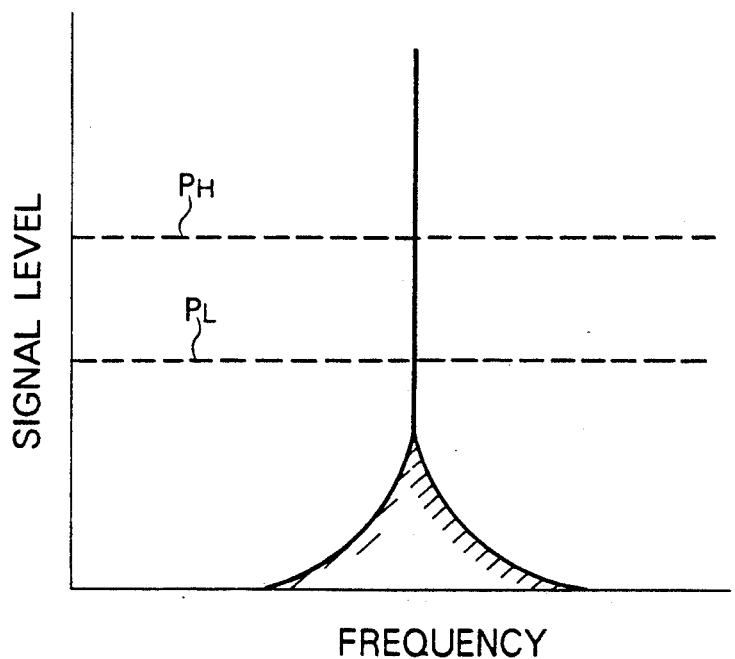

As is apparent from the above description, the enhancer 10 provides a small insertion-loss for a high-level signal but a large insertion loss for a low-level signal. Hence, by setting the level of a desired signal to the level $P_H$ or more and the level of an undesired signal or noise to the level $P_L$ or less, it is possible to improve a ratio of the desired signal to the noise included in the output signal 4 by the level Le. As shown in FIGS. 4A and 4B, however, the closer the noise exists to a high-level signal, the smaller the attenuation of the noise is. Hence, strictly speaking, the enhancer 10 serves to change the noise distribution.

Figure 5:
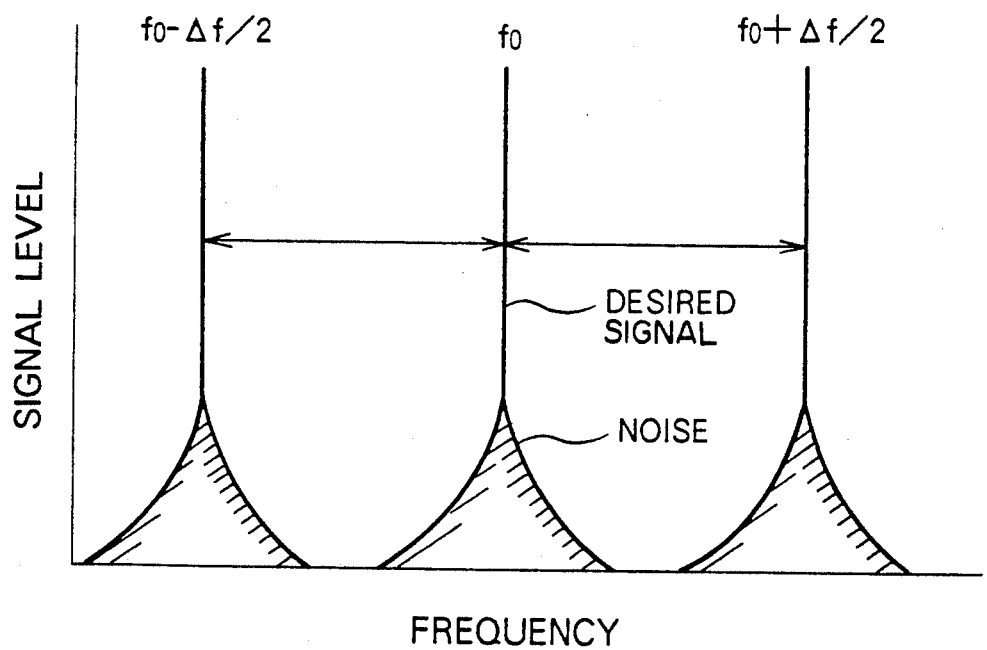
FIG. 5 is a spectrum diagram showing tracking operation of the MSW S/N enhancer.
Figure 6:
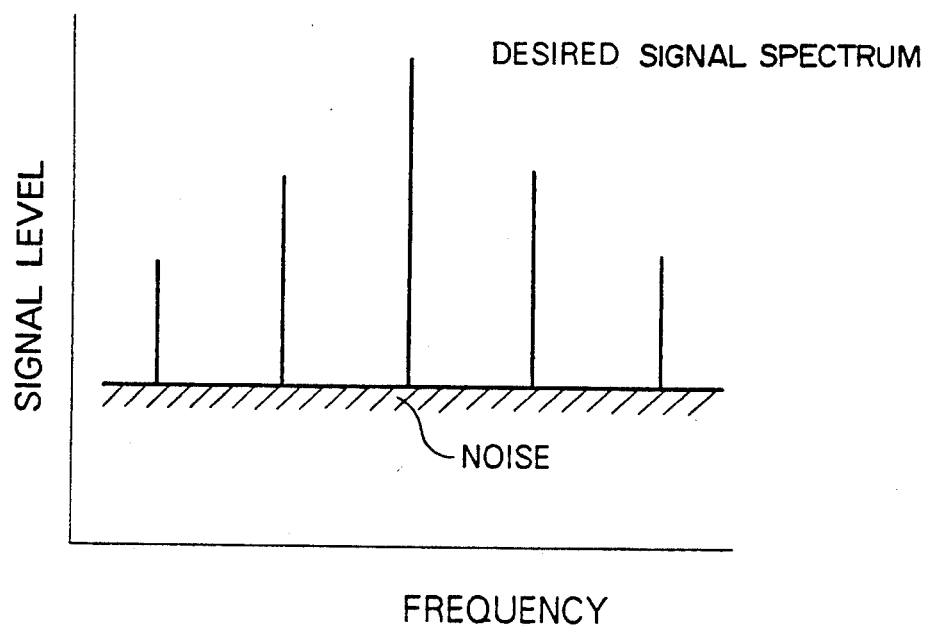
FIGS. 6A and 6B are diagrams, respectively, showing an input spectrum and an output spectrum appearing when a signal having sidebands is input to the MSW S/N enhancer.
Figure 6:
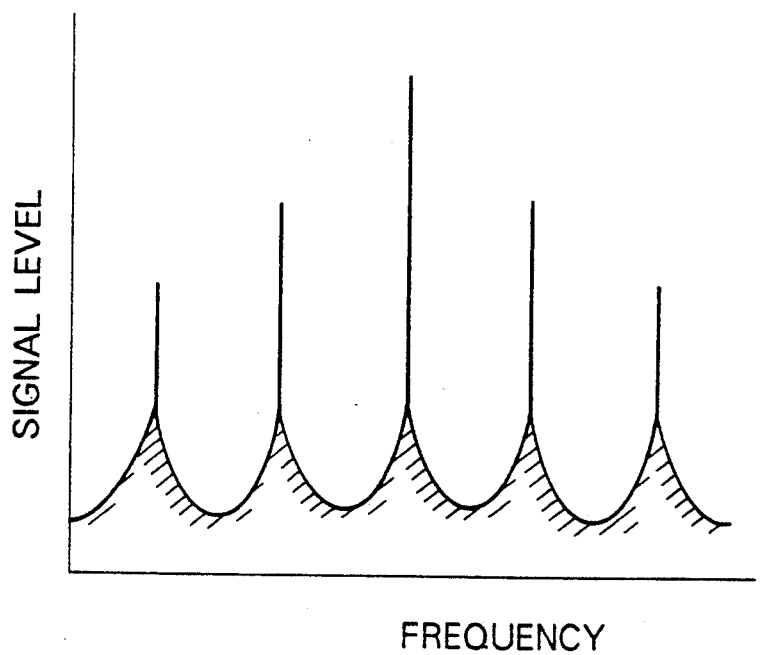

If the enhancer 10 has the foregoing characteristics when a signal is not FM-modulated and can serve as a tracking filter chasing an instant frequency of the received FM signal (see FIG. 5), the noise power can be reduced. Considering the spectrum of the FM signal, when the signal having the spectrum shown in FIG. 6A is input to the enhancer 10, it is possible to improve the C/N of the signal 4 input to the demodulator 40. Therefore, the demodulated signal having a spectrum shown in FIG. 6B appears at the output port, improving the S/N of the demodulated signal.

In turn, the description will be directed to the first and second embodiments of the magnetostatic wave S/N enhancer used in the receiving apparatus of the present invention.

As is apparent from FIG. 3, the forgoing magnetostatic wave (MSW) device, that is, the MSW S/N enhancer 10 has a threshold power level $P_L$ of about $-6$ dBm and an enhancement-limiting power level $P_H$ of about $+15$ dBm. The I/O characteristic gradually varies from the $P_H$ to the $P_L$. As a result, sufficient enhancement cannot be achieved for a very low C/N signal. To overcome this shortcoming, the first embodiment employs two microwave-MSW transducers having identical I/O characteristics. One of the two transducers is set to be in saturation operation, while the other is set to be in linear operation which means that the I/O characteristics is lineary. The outputs of these two transducers are combined in opposite phase.

Then, the description will be directed to the first embodiment of the MSW enhancer 10 used in the receiving apparatus of the present invention to the appended drawings.

Figure 8:
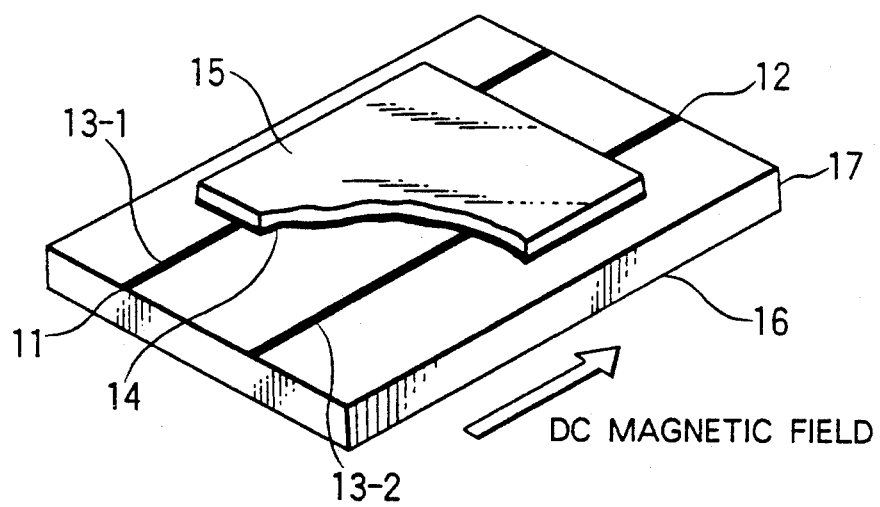
FIG. 8 is a view showing structure of a microwave-MSW transducer used in the MSW S/N enhancer according to the first and the second embodiments.
Figure 7A:
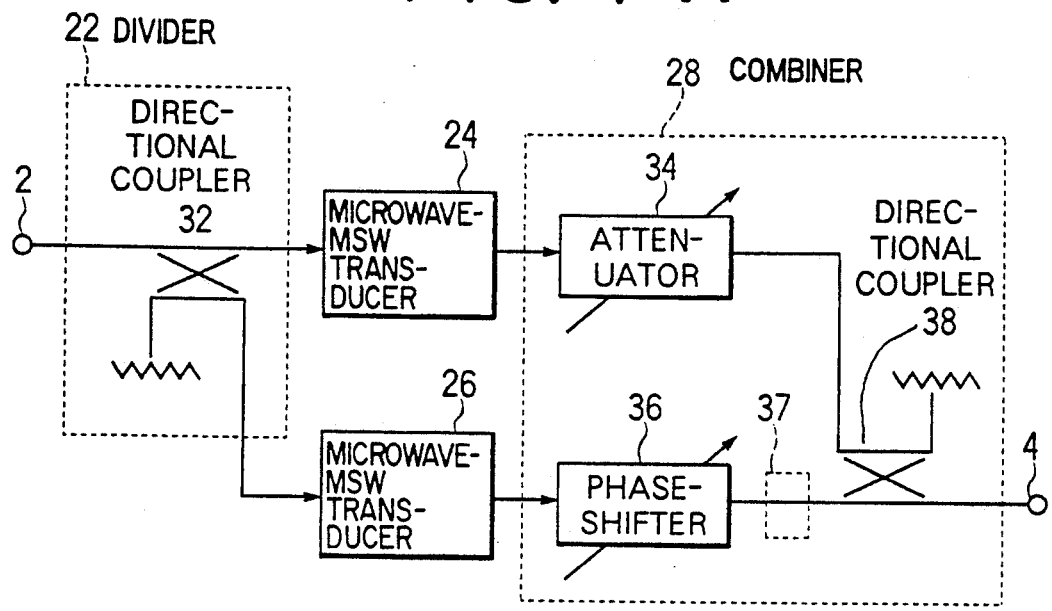
FIGS. 7A and 7B are block diagrams, respectively, showing arrangements of a first and a second embodiments of the MSW S/N enhancer of the present invention.

FIG. 7A is a block diagram showing an arrangement of the first embodiment of the MSW S/N enhancer 10. Two microwave-MSW transducers 24 and 26 are formed on the same substrate so that the transducers have the same characteristics under the condition of any environment. The structure of the transducer is shown in FIG. 8. This transducer employs a sheet of YIG film 14 grown on the GGG 15 and two microstrip lines 13-1 and 13-2 provided on a dielectric substrate 17. One side of the microstrip lines 13-1 and 13-2 is connected to ground plane 16.

Figure 9:
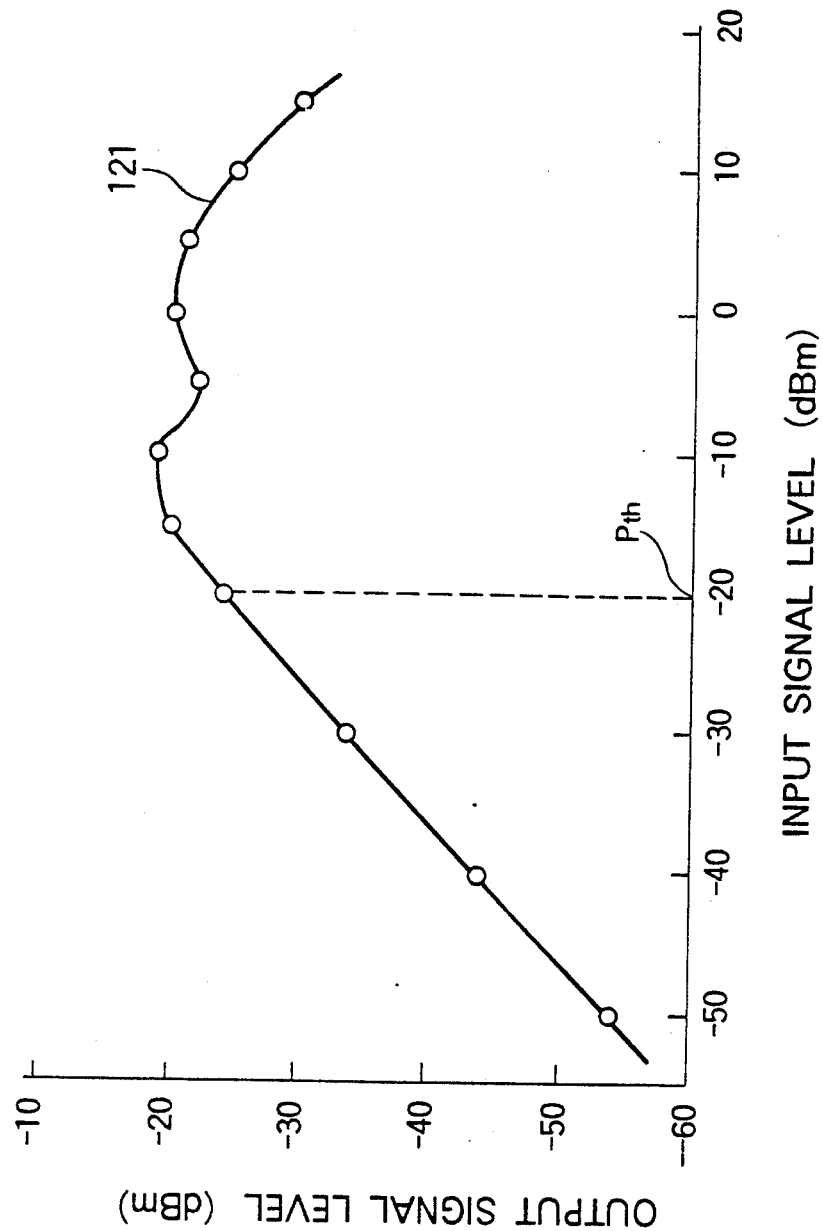
FIG. 9 is a plot showing an input-to-output characteristic of the microwave-MSW transducer.

A microwave signal input from an input port 11 to the line 13-1 is transduced into a magnetostatic wave in proportion to the I/O characteristic of the transducer shown in FIG. 9. The transduced magnetostatic wave is propagated to the line 13-2 through the YIG thin film 14. When it reaches the line 13-2, the magnetostatic wave is inversely transduced into a microwave. The transduced microwave is output from the output port 12. As shown in FIG. 9, the transducer has the I/O characteristic which keeps linear until a threshold power level $P_{th}$ but is saturated over the level $P_{th}$. The $P_{th}$ is substantially determined due to the property of the YIG. The operating frequency band of the transducer can be adjusted by changing the shape of the microstrip line or changing the intensity of the magnetic field.

Figure 11A:
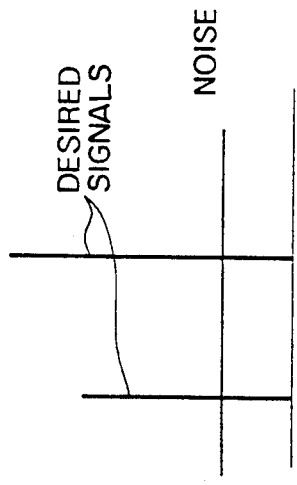
FIGS. 11A to 11D are views for illustrating operation of the MSW S/N enhancer according to the first embodiment.
Figure 11B:
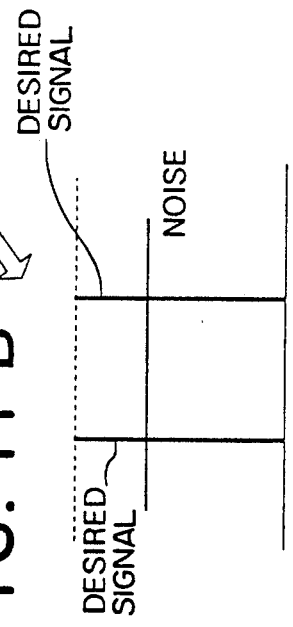
Figure 11C:
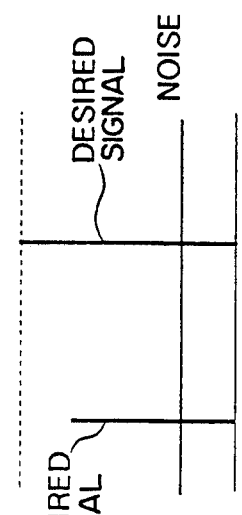

Then, the description will be directed to how to act as MSW S/N enhancer. A received signal 2 as shown in FIG. 11A is divided into a first and a second path signals different in power level through a divider 22 such as a directional coupler 32. Those two signals are supplied to the microwave-MSW transducers 24 and 26, respectively. The first signal is a high-level signal, while the second signal is a low-level signal. The first signal via the transducer 24 contains desired component signals and undesired signals such as noise which are higher and lower, respectively, than the threshold power level $P_{th}$ shown in FIG. 9. The noise is output without amplitude limitation from the transducer 24. On the other hand, each component signal is output with amplitude limitation due to the frequency-selective saturation of MSW as shown in FIG. 11B. All the transretransduced first component signals are supplied to an attenuator 34 and a directional coupler 38 in a combiner 28.

On the other hand, all the component signals of the second path signal are always set to be lower than the level $P_{th}$. Hence, the second path signal is output without amplitude limitation as shown in FIG. 11B. The trans-retranced second signal is supplied to a phase shifter 36 in the combiner 28.

Figure 11D:
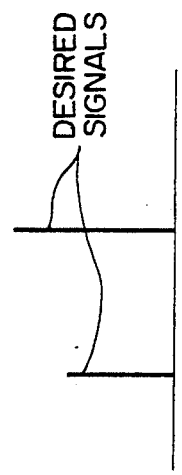

The attenuator 34 serves as a trimmer for compensation of the loss of the phase shifter 36. The phase shifter 36 shifts the phase of the trans-retranced second signal by 180°, that is, the phases of the two signals are opposite to each other in the front of a directional coupler 38. The directional coupler 38 combines the two path signals in opposite phase to each other and equal amplitude for the component signals of below $P_{th}$. As a result the output signal 4 as shown in FIG. 11D is obtained.

Figure 10:
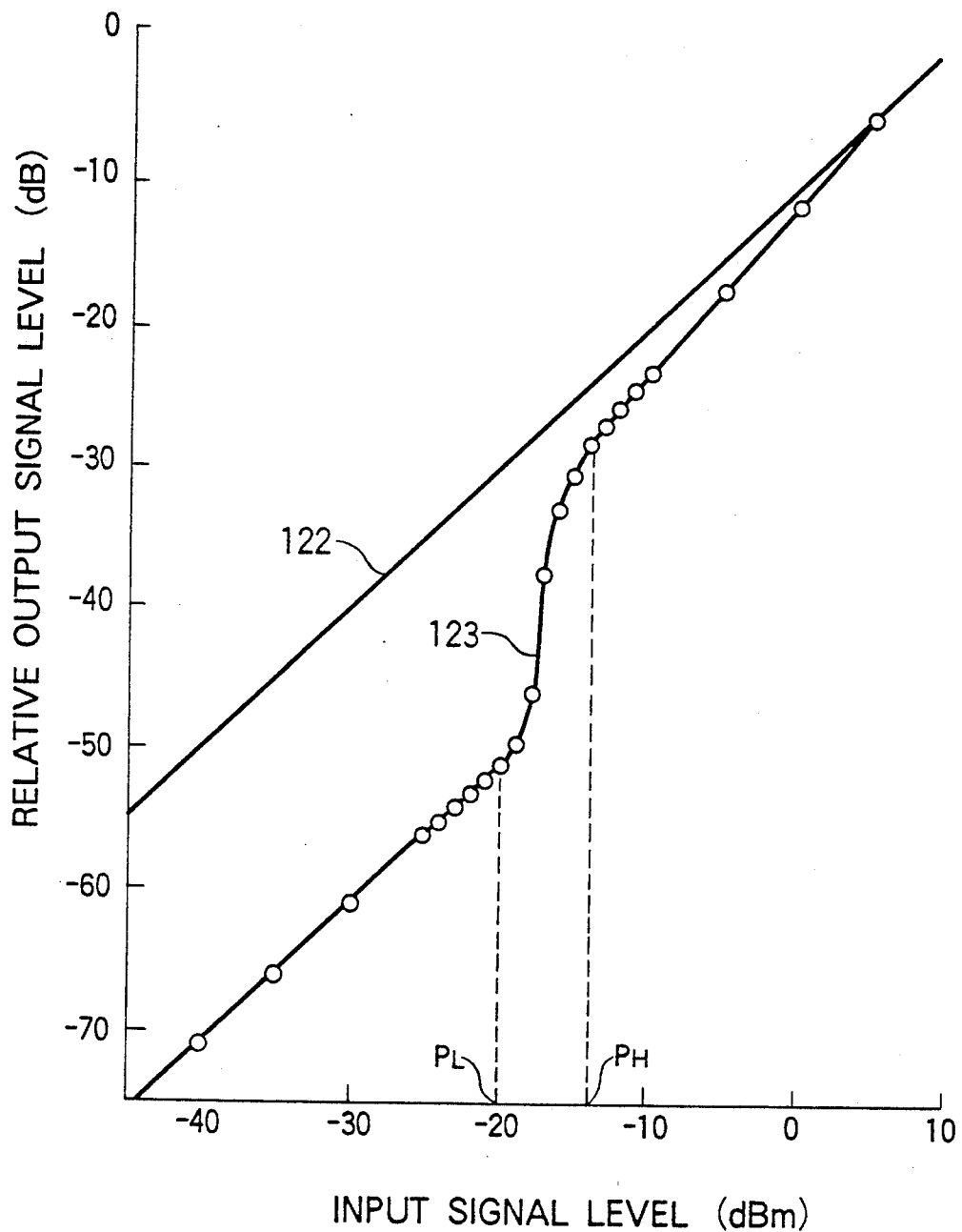
FIG. 10 is a plot showing an input-to-output characteristic of the MSW S/N enhancer according to the first embodiment.

FIG. 10 shows a measured I/O characteristic of the MSW S/N enhancer 10 using the two microwave-MSW transducers when directivity of the directional couplers 32 and 38 is −30 dB. The lines 122 and 123 shown in FIG. 10 are similar to those shown in FIG. 3 in meaning. Compared with both characteristics shown in FIGS. 10 and 3, the enhancer shown in FIG. 3 has gradual change of the I/O Characteristic from the $P_L$ to the $P_H$, because the difference between the $P_L$ (−6 dBm) and the $P_H$ (+15 Bm) is large (21 dB), while the enhancer according to the present embodiment has steep change of the I/O characteristics, because the difference between the $P_L$ (−20 dBm) and the $P_H$ (−14 dBm) is small (6 dB). In case that the ratio of a desired signal to noise is 2 to 3 dB, the enhancement of the enhancer shown in FIG. 3 is limited to about 5 dB, while the enhancement of the enhancer according to the present embodiment can be 15 dB or more. It is possible to obtain larger enhancement in principle. Compared with the absolute power level values of the $P_L$ and $P_H$, the enhancer according to the present embodiment can lower the level $P_L$ by about 15 dB and the level $P_H$ by about 30 dB. It means that the present enhancer can reduce the operating power level of the input signal by 15 dB or more.

As for the enhancer shown in FIG. 7A, when the two transducers 24 and 26 have the same characteristics as described above even if a d.c. magnetic field or temperature of the environment is changed, it is possible to almost cancel the influence due to the change in the magnetic field or the temperature. In case that the phase shifter 36 is lossless it is obvious that the attenuator 34 can be omitted. The phase shifter 36 may be a replaced by a delay line or a long transmission line. Further, in the foregoing arrangement, the first path signal via the transducer 24 is attenuated by an attenuator 34 and is supplied to the coupler 38. Alternatively, an amplifier 37 may be provided in the second signal path in place of the attenuator 34.

Figure 7B:
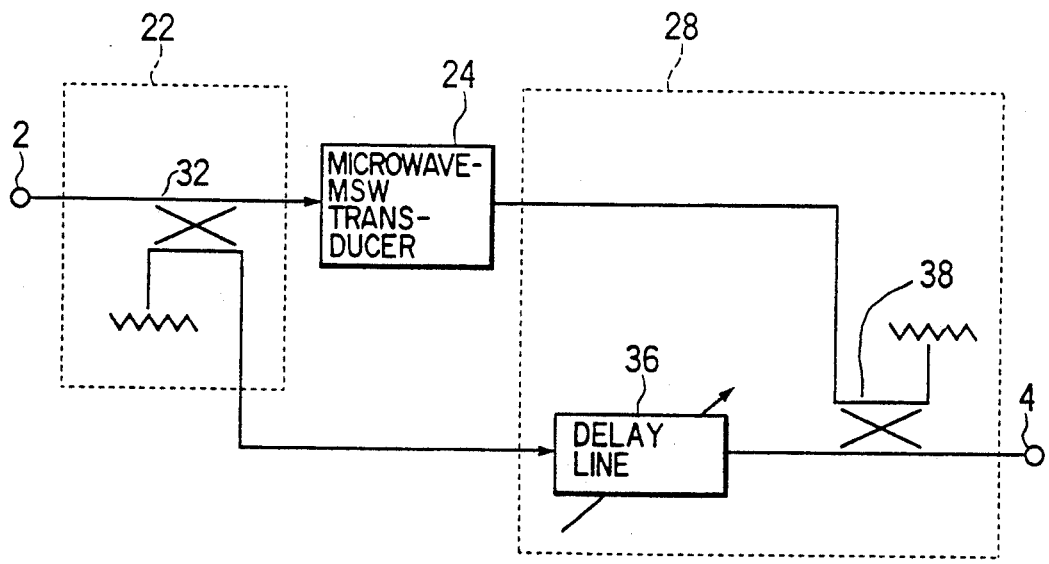

In turn, the description will be directed to the MSW S/N enhancer according to the second embodiment with reference to FIG. 7B. This embodiment provides a simplified circuit for reducing the cost of the MSW S/N enhancer. The different respect of the present enhancer from the enhancer shown in FIG. 7A is that the transducer 26 and the attenuator 34 are removed. Due to frequency dependency of the delay an effective operating frequency band of the enhancer becomes narrower than that shown in FIG. 7A. However, the present enhancer can enhance the S/N equivalent to the first embodiment.

As described above, according to the receiving apparatus of the present invention, by employing the MSW S/N enhancer, noise power near an instant frequency of an FM signal or a PM signal can be reduced and the C/N of the signal input to the FM or PM demodular can be enhanced. As a result, it is possible to simplify the receiving apparatus and to lower the cost of the receiving apparatus. For example, a BS receiving antenna can be reduced in size.

When the C/N of the input signal is low, the C/N enhancement by the enhancer used in the receiving apparatus can be remarkably increased much more than the prior art, and can considerably reduce the power level of the input signal. Hence, the S/N of a demodulated signal may be improved for an FM signal or a PM signal of a low C/N.

Furthermore, if the enhancer is arranged to have two identical microwave-MSW transducers, the arrangement is advantageous to reducing the influence on the enhancer due to the change of the physical property of the YIG and the change of the external d.c. magnetic field.

Having described the present invention, it will be easily understood by skilled persons in the art that the present invention is not limited to the above embodiments and many variations and modifications may be made to the invention within the scope of the appended claims.

What is claimed is:

1. A magnetostatic wave (MSW) signal-to-noise (S/N) enhancer comprising:

means for dividing an input signal into a first path signal and a second path signal, said first path signal containing at least a desired signal being higher than a first path threshold power level and noise being lower than the first path threshold power level and all the component signals including noise of said second path signal being lower than a second path threshold power level;

first microwave-MSW transducing means having the first path threshold power level, for transducing the first path signal into a first path transduced signal, the noise of the first path signal being transduced in linear operation, and the desired component signals being transduced in saturation operation;

second microwave-MSW transducing means having the second path threshold power level and for transducing the second path signal into a second path transduced signal, all the second path component signals being transduced in linear operation; and combining means for combining the first and second path transduced signals in opposite phase to each other.

2. An MSW S/N enhancer according to claim 1, wherein said combining means includes first phase shifting means for shifting a phase of the first path transduced signal to an opposite phase with respect to the second path transduced signal.

3. An MSW S/N enhancer according to claim 2, wherein said first phase shifting means comprises first delay means for delaying the first path transduced signal.

4. An MSW S/N enhancer according to claim 1, wherein said combining means includes second phase shifting means for shifting a phase of said second path transduced signal to an opposite phase with respect to the first path transduced signal.

5. An MSW S/N enhancer according to claim 4, wherein said second phase shifting means comprises second delay means for delaying said second path transduced signal.

6. An MSW S/N enhancer according to claim 1, wherein said first and second microwave-MSW transducing means have the substantially same characteristics, said first path threshold power level is substantially equal to said second path threshold power level, and said combining means includes attenuating means for attenuating the first path transduced signal to a predetermined level.

7. An MSW S/N enhancer according to claim 1, wherein said dividing means comprises directional coupling means for dividing the input signal into the first and second path signals.

8. An MSW S/N enhancer according to claim 1, wherein said combining means includes directional coupling means for combining the first and second path transduced signals.

9. An MSW S/N enhancer according to claim 1, wherein said first microwave-MSW transducing means includes means for controlling a gain of the first path signal.

10. An MSW S/N enhancer according to claim 1, wherein said second microwave-MSW transducing means includes means for controlling a gain of the second path signal.

11. An MSW S/N enhancer according to claim 1, wherein said combining means includes means for controlling a gain of the first path transduced signal.

12. An MSW S/N enhancer according to claim 1, wherein said combining means includes means for controlling a gain of the second path transduced signal.

13. A magnetostatic wave (MSW) signal-to-noise (S/N) enhancer comprising:

means for dividing an input signal into first and second path signals, said input signal containing desired signal components and a noise component, a level of th first path signal noise component is lower than a threshold level;

microwave-MSW transducing means connected to said dividing means to receive the first path signal and having a saturated transduction characteristic with respect to the threshold level for the first path signal, for transducing the first path signal into a first path transduced signal such that the first path signal noise component is linearly transduced and that the first path signal components are saturatedly transduced to substantially a predetermined level; and combining means for combining the first path transduced signal and the second path signal in opposite phase to each other to obtain a difference between the signals.

14. An MSW S/N enhancer according to claim 13, wherein said combining means includes second path phase inverting means for inverting a phase of the second path signal to an opposite phase.

15. An MSW S/N enhancer according to claim 14, wherein said phase inverting means comprises delay means for delaying the second path signal.

16. An MSW S/N enhancer according to claim 13, wherein said combining means includes phase inverting means for inverting a phase of the first transduced path signal to an opposite phase.

17. An MSW S/N enhancer according to claim 16, wherein said phase inverting means comprises delay means for delaying the first transduced path signal.

18. An MSW S/N enhancer according to claim 13, wherein said combining means includes attenuating means for attenuating the first path transduced signal to a predetermined level.

19. An MSW S/N enhancer according to claim 13, wherein said dividing means comprises directional coupling means for distributing the input signal into the first and second path signals.

20. An MSW S/N enhancer according to claim 13, wherein said combining means includes directional coupling means for combining the first path transduced signal and the second path signal.

21. An MSW S/N enhancer according to claim 13, further comprising inverting means for inverting a phase of one of the first and second path signals to an opposite phase.

22. An MSW S/N enhancer according to claims 13, wherein said microwave-MSW transducing means includes means for controlling a gain of one of the first path signal and the first path transduced signal.

23. A magnetostatic wave (MSW) signal-to-noise (S/N) enhancer in accordance with claim 13, wherein said microwave-MSW transducing means further includes two strip lines.

24. AN MSW S/N enhancer according to claim 23, wherein said combining means includes second path phase inverting means for inverting a phase of the second path signal to an opposite phase.

25. An MSW S/N enhancer according to claim 24, wherein said sad phase inverting means comprises delay means for delaying the second path signal.

26. An MSW S/N enhancer according to claim 23, wherein said combining means includes phase inverting means for inverting a phase of the first transduced path signal to an opposite phase.

27. An MSW S/N enhancer according to claim 26, wherein said phase inverting means comprises delay means for delaying the first transduced path signal.

28. An MSW S/N enhancer according to claim 23, wherein said combining means includes attenuating means for attenuating the first path transduced signal to a predetermined level.

29. An MSW S/N enhancer according to claim 23, wherein said dividing means comprises directional coupling means for distributing the input signal into the first and second path signals.

30. An MSW S/N enhancer according to claim 23, wherein said combining means includes directional coupling means for combining the first path transduced signal and the second path signal.

31. An MSW S/N enhancer according to claim 23, wherein said microwave-MSW transducing means includes means for controlling a gain of one of the first path signal and the first path transduced signal.

32. A receiving apparatus comprising:
C/N-enhancing means including at least one magnetostatic wave (MSW) signal-to-noise (S/N) enhancer for dividing a signal input thereto into first and second signals, said signals including desired components and a noise component, for extracting a first signal noise component substantially from the first signal, and for obtaining a difference between the second signal and the first signal noise component to output a carrier-to-noise ratio (C/N)-enhanced signal; and
demodulating means for demodulating a desired signal from said C/N-enhanced signal.

33. A receiving apparatus according to claim 32, wherein said MSW S/N enhancer comprising:
dividing means for dividing the input signal into the first and second signals, said first signal containing desired signal components higher than a first threshold power level and noise lower than the first threshold power level, and the second signal being lower than a second threshold power level;
first microwave-MSW transducing means having the first threshold power level, for transducing said first signal into a first transduced signal, the noise of said first path signal being transduced in a linear operation and the desired components being transduced in saturation operation; and
second microwave-MSW transducing means having the second threshold power lever, for transducing the second signal into a second transduced signal, the second signal being transduced in a linear operation; and
combining means for combining the first and second transduced signals in opposite phases to each other.

34. A receiving apparatus according to claim 32, wherein said MSW S/N enhancer comprising:
means for dividing the signal input to said enhancer into first and second signals, said first signal containing desired signal components higher than a threshold power level and a noise component lower than the threshold power level;
microwave-MSW transducing means having the threshold power level, for transducing said first signal into a first transduced signal, the noise of said first signal being transduced in a linear operation and the desired signal components thereof being transduced in a saturation operation; and
combining means for combining the first transduced signal and the second signal in opposite phase to each other.

35. A receiving apparatus according to claim 32, wherein said C/N-enhancing means includes a plurality of MSW S/N enhancers connected in a cascade manner to said MSW S/N enhancer for further enhancing the C/N of the same frequency band as said MSW S/N enhancer.

36. A receiving apparatus according to claim 32, wherein said C/N-enhancing means includes a plurality of MSW S/N enhancers connected in parallel for enhancing the C/N of different frequency bands.

37. A receiving apparatus according to claim 32, wherein said C/N enhancing means includes a plurality of MSW S/N enhancers connected in cascade and parallel, for enhancing the C/N of a frequency band of each cascade connection and enhancing the C/N of different frequency bands for each parallel connection.

38. A method for improving an S/N of an input FM signal or PM signal comprising the steps of:
dividing the input signal into first and second path signals; said input signal containing desired signal components and a noise component, a level of the first path signal noise component is lower than a threshold power level;
saturating said first path signal in frequency-selective saturation based on said threshold power level; and
combining said first path signal in saturation and said second path signal in opposite phase to each other to obtain a difference between the signals.

* * * * *